United States Patent
Gossmann

(10) Patent No.: US 7,236,029 B2
(45) Date of Patent: Jun. 26, 2007

(54) FLIP-FLOP CIRCUIT ARRANGEMENT AND METHOD FOR PROCESSING A SIGNAL

(75) Inventor: Timo Gossmann, Neubiberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/065,470

(22) Filed: Feb. 24, 2005

(65) Prior Publication Data

US 2005/0195006 A1    Sep. 8, 2005

(30) Foreign Application Priority Data

Feb. 26, 2004    (DE) .................... 10 2004 009 283

(51) Int. Cl.
H03K 3/289    (2006.01)
(52) U.S. Cl. .................... 327/202; 327/218
(58) Field of Classification Search ........ 327/202–203, 327/210–213, 218
See application file for complete search history.

(56) References Cited

U.S. PATENT DOCUMENTS 4,977,335 A * 12/1990 Ogawa ................. 327/204
5,815,019 A * 9/1998 Uemura et al. ............. 327/202
5,844,437 A * 12/1998 Asazawa et al. ............ 327/202
6,166,571 A    12/2000 Wang
6,218,878 B1    4/2001 Ueno
6,559,693 B2 * 5/2003 Tung et al. ................. 327/115

FOREIGN PATENT DOCUMENTS

EP    0 692 872 A2    1/1996

* cited by examiner

Primary Examiner—Long Nguyen
Assistant Examiner—Ryan Jager
(74) Attorney, Agent, or Firm—Eschweiler & Associates, LLC

(57) ABSTRACT

A flip-flop circuit arrangement and an associated method are disclosed, wherein a changeover between a master and a slave block is not effected by switching on and switching off respective current sources, but rather by impressing a compensation current that effects the changeover. One or more aspects of the present invention make it possible to reduce a supply voltage and at the same time, on account of low parasitic capacitances of the circuit, to provide a frequency divider in the gigahertz range which can be integrated using MOS circuit technology.

17 Claims, 4 Drawing Sheets

FLIP-FLOP CIRCUIT ARRANGEMENT AND METHOD FOR PROCESSING A SIGNAL

REFERENCE TO RELATED APPLICATIONS

This application claims the benefit of the priority date of German application DE 10 2004 009 283.4, filed on Feb. 26, 2004, the contents of which are herein incorporated by reference in their entirety.

FIELD OF THE INVENTION

The present invention relates to a flip-flop circuit arrangement, the use thereof in a frequency divider, and to a method for processing a signal.

BACKGROUND OF THE INVENTION

It is increasingly being endeavored to produce integrated circuits for radiofrequency applications with pure complementary MOS, metal oxide semiconductor, circuit technology rather than bipolar circuit technology or so-called BiCMOS circuit technology to achieve higher integration densities and more cost-effective mass production.

Frequency dividers are normally constructed with toggle flip-flops. A toggle flip-flop generally corresponds to a D-type flip-flop whose inverting output is fed back to its D input. Toggle flip-flops are bistable digital circuits which switch over their output level from low to high or from high to low with each input clock. Consequently, the input frequency is divided by two.

In large scale integrated radiofrequency modules in which frequency dividers are to be used to divide down a frequency provided by an integrated oscillator in the gigahertz range, differential signal processing is normally required or at least advantageous. The oscillator usually requires a symmetrical and, as far as possible, purely capacitive load.

Moreover, it is desirable for the output signal of the frequency divider to have a symmetrical duty ratio. This means that the duration of the high level and the duration of the low level of the output signal are of the same length.

As the integration density increases, integrated semiconductor circuits are also intended to be suitable for ever smaller supply voltages. Therefore, a further requirement made of an integrated flip-flop circuit arrangement is a small number of transistor stages or other components stacked one above the other between a supply potential terminal and a reference potential terminal.

Furthermore, it is desirable to keep the number of internal circuit nodes as small as possible within the flip-flop circuit, in order to reduce the capacitive load. At high clock frequencies, in particular, capacitive, parasitic loads have to be continually subjected very rapidly to charge reversal.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

A flip-flop circuit arrangement is disclosed, as well as a method for processing a signal with the circuit. The circuit can be implemented with integrated metal oxide semiconductor, MOS, circuit technology and is suitable for operation with small supply voltages and with a small number of circuit nodes.

A flip-flop circuit arrangement according to one or more aspects of the present invention includes a pair of input terminals designed for feeding in a differential clock signal (CLKP, CLKN), and a pair of output terminals designed for tapping off a differential output signal (OUTP, OUTN). The arrangement also includes a master holding stage coupled to a master differential stage, and a slave holding stage coupled to a slave differential stage. The master differential stage, the master holding stage, the slave differential stage and the slave holding stage are coupled to one another in order to form a flip-flop structure. Also, the pair of output terminals is formed at the output of the slave differential stage. At a symmetrical base point, respective current terminals of the master differential stage, of the master holding stage, of the slave differential stage and of the slave holding stage are connected to one another and to respective current sources for feeding the master and slave differential and holding stages. The arrangement further includes a means for providing a compensation current which is coupled to the pair of input terminals and to the symmetrical base point in order to compensate for the current provided by at least one of the current sources in a manner dependent on the differential clock signal (CLKP, CLKN). Further, inputs of the slave differential stage are coupled to outputs of the master differential stage in a noninverting manner, and inputs of the master differential stage are coupled to outputs of the slave differential stage in an inverting manner.

A method for processing a signal according to one or more aspects of the present invention includes providing a differential clock signal (CLKP, CLKN), and changing between a master differential stage and a slave differential stage of a flip-flop circuit arrangement in a manner dependent on the differential clock signal (CLKP, CLKN). The method also includes providing a compensation current (I), and alternating compensation of a current supplying the master differential stage or of a current supplying the slave differential stage with the compensation current (I) in a manner dependent on the differential clock signal (CLKP, CLKN).

In one example, differential stages and holding stages in a master block and a slave block of the flip-flop circuit arrangement are fed by current sources which are not switched on and off in the actual sense by the clock signal. Rather, provision is made for deactivating the respectively unrequired current source by feeding in a compensation current which compensates precisely for the current provided by the respective current source. The respective master or slave differential stage is thereby deactivated.

Preferably, the master differential stage and the slave holding stage are in each case activated simultaneously in a first clock phase. In this manner, the slave differential stage and the master holding stage are simultaneously deactivated by application of a corresponding compensation current. The opposite holds true in a second clock phase where the master differential stage and the slave holding stage are deactivated, while the master holding stage and the slave differential stage are simultaneously activated.

Preferably, respective differential and holding stages are assigned a respective current source which supplies the differential stage and the holding stage with current at the base point.

Since no additional differential stage is necessary for changing over between master differential stage and slave differential stage or between differential stage and holding stage, both in the master block and in the slave block, it is advantageously possible to connect the current source directly to the base point of the differential stage and/or of the holding stage. This enables operation with particularly small supply voltages.

Preferably, the master differential stage, the master holding stage, the slave differential stage and the slave holding stage respectively comprise a transistor pair. The respective transistor pairs can have two inputs, two outputs and a current terminal.

With unipolar MOS circuit technology, the respective transistor pairs can comprise two transistors whose source terminals are connected to one another and form the current terminal of the respective stage. This common source node is further preferably connected to a terminal of a current source. The current source is preferably connected with respect to a reference potential terminal.

The inputs and outputs of the holding stages are preferably cross-coupled to one another.

The outputs of the master holding stage are preferably coupled to the outputs of the master differential stage. The slave differential stage is connected to the slave holding stage in an analogous manner.

In order to form a toggle flip-flop, the inputs of the slave differential stage are coupled to the outputs of the master differential stage in a noninverting manner. Furthermore, the inputs of the master differential stage are coupled to the outputs of the slave differential stage in an inverting manner. In this case, the functions of master and slave are interchangeable, in principle, on account of their preferably identical construction.

Preferably, respective differential and holding stages are assigned a dedicated current source. As an alternative, however, it is also possible to combine the current sources of the stages that are respectively activated and deactivated simultaneously.

The means for providing a compensation current may be realized, for example, by the provision of a current source which, in a manner dependent on the clock signal, is connected either to one terminal of the two terminals or to the other terminal of the two terminals of the symmetrical base point of the circuit. In this case, the current source is preferably connected with respect to a supply potential terminal of the circuit arrangement. An even further reduction of the required supply voltage is thereby possible.

As an alternative, the means for providing a compensation current is realized with two series capacitances connected between the symmetrical input terminal and the symmetrical base points. The clock signal is accordingly coupled capacitively. In this case, the compensation current for compensation of the current sources assigned to those stages which are precisely to be deactivated is formed from capacitive charge-reversal currents and obtained through the direct capacitive coupling of the inputs to a preceding stage. A dedicated compensation current source can thus be dispensed with. Resonance effects are advantageously exploited in this case. If the flip-flop is fed directly by an oscillator, the coupling capacitances may advantageously form part of a resonator of the oscillator, and preferably an LC resonant circuit.

If necessary, operating point setting of the circuit may be effected in a simple manner by virtue of a means for operating point setting coupled to the symmetrical base point.

The means for operating point setting preferably comprises a current mirror.

The current mirror preferably has an input transistor fed from a source. The source is preferably adapted to the electrical loads of the differential and holding stages.

The current mirror preferably has a plurality of coupling-out transistors which represent the current sources assigned to the differential and holding stages.

Furthermore, the current mirror, for providing a common-mode position, is preferably coupled by coupling resistors to the symmetrical base point.

By way of example (and not limitation), when an exemplary flip-flop circuit arrangement is integrated using a conventional 250 nm fabrication technology, it is possible to realize operating frequencies of more than 5 GHz at supply voltages of less than 2.0 V with a low outlay. An even higher operating frequency is possible in the case of higher integration densities.

On account of its radiofrequency properties, the small supply voltage, the small number of internal circuit nodes and also the complete integrability in unipolar fabrication processes, the flip-flop circuit arrangement is particularly suitable for application as a radiofrequency frequency divider. In this case, a signal having half the input clock frequency is provided at the output.

With regard to the method, a changeover is effected in a flip-flop circuit arrangement by generating and impressing respective compensation currents. In this case, although those stages which are to be deactivated continue to be fed by a feed current, a compensation current that compensates for said feed current is fed in, so that the respectively assigned stage is actually de-energized. As a result, it is possible to manage with a particularly small number of internal circuit nodes and a small supply voltage.

The compensation current is preferably generated by means of a compensation current source fed by a supply voltage.

As an alternative, the compensation current may also be provided as a capacitive charge-reversal current together with the differential clock signal. Accordingly, the capacitive current is generated with the aid of series capacitances from the voltage swing of the output of the previous stage.

If necessary, operating point setting of the differential stages is possible in a simple manner by feeding in a symmetrical common-mode level.

A master differential stage and a slave holding stage are activated and a slave differential stage and a master holding stage are deactivated, and vice versa, in a manner dependent on the clock signal. In this case, the stages are deactivated by application of a respective compensation current.

BRIEF DESCRIPTION OF THE DRAWINGS

The invention is explained in more detail below wherein reference is made to the following drawings.

DETAILED DESCRIPTION OF THE INVENTION

Figure 1:
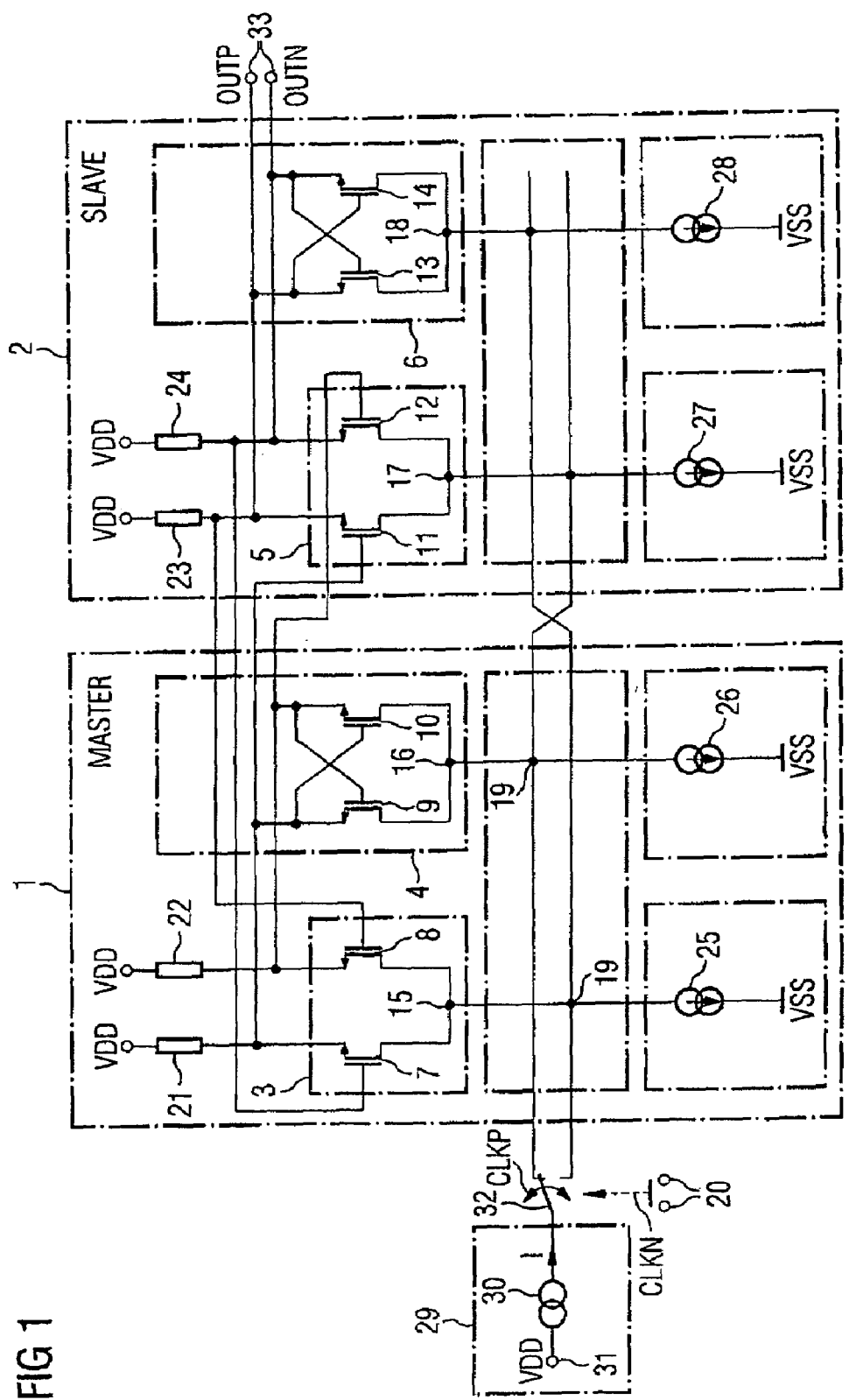
FIG. 1 is a schematic block diagram illustrating an exemplary flip flop circuit arrangement according to one or more aspects of the present invention.

One or more aspects of the present invention will now be described with reference to the drawing figures, wherein like reference numerals are used to refer to like elements throughout. It should be understood that the drawing figures and following descriptions are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details. Thus, it will be appreciated that variations of the illustrated systems and methods apart from those illustrated and described herein may exist and that such variations are deemed as falling within the scope of the present invention and the appended claims.

FIG. 1 illustrates a flip-flop circuit arrangement according to one or more aspects of the present invention that includes a master block 1 and a slave block 2. The master block 1 comprises a master differential stage 3 and also a master holding stage 4. Likewise, the slave block 2 also comprises a slave differential stage 5 and a slave holding stage 6. Each of the differential and holding stages 3, 4, 5, 6 comprises two n-channel MOS transistors 7, 8; 9, 10; 11, 12; 13, 14, respectively, which are connected to one another on the source side. The common source terminal of the differential and holding stages 3, 4, 5, 6 simultaneously forms respective current terminals 15, 16, 17, 18 thereof. The current terminals 15, 18 of the master differential stage 3 and of the slave holding stage 6 are connected to one another. Similarly, the current terminals 16, 17 of the master holding stage 4 and of the slave differential stage 5 are connected to one another. These two connecting nodes of the current terminals 15, 16, 17, 18 form a symmetrical base point 19. The symmetrical base point 19 is connected to a pair of input terminals which are designed for feeding in a differential clock signal CLKP, CLKN.

The two inputs of the transistor pair 9, 10 of the master holding stage 4 are cross-coupled to the outputs thereof. The outputs of the transistor pairs 7, 8; 9, 10 of master differential stage 3 and master holding stage 4 are connected to one another in pairs. The transistor pairs 11, 12; 13, 14 of slave differential stage 5 and slave holding stage 6 are connected in an analogous manner. The outputs of the transistor pairs 7, 8; 11, 12 of the master and slave differential stages 3, 5 are connected to a supply potential terminal VDD of the circuit arrangement via resistors 21, 22, 23, 24, which represent an electrical load.

In addition, the slave differential stage 5 is connected by the inputs of its transistor pair 11, 12 to the outputs of the master differential stage 3 at the transistor pair 7, 8. In an inverting coupling, by contrast, the outputs of the transistor pair 11, 12 of the slave differential stage 5 are connected to the inputs of the transistor pair 7, 8 of the master differential stage 3. A toggle flip-flop is thus formed. The toggle flip-flop operates as a divide-by-two frequency divider when driven with a clock signal. The current terminals 15, 16, 17, 18 of the master and slave differential and holding stages 3, 4, 5, 6 are connected to a reference potential terminal VSS via respective current sources 25, 26, 27, 28.

In order to provide compensation current, a compensation current source 30 is provided in a means for providing a compensation current 29. The compensation current source 30 is connected between a reference potential terminal 31 and a load terminal of a switch 32. Depending on the switch position, a further load terminal of the switch 32 can be connected to one of the terminals of symmetrical base point 19. A pair of input terminals 20 are also included for feeding in a clock signal CLKP, CLKN, depending on how the switch 32 is driven.

The compensation current source 30 is designed in such a way that, depending on the switch position, the current sources 25, 28; 26, 27 respectively connected thereto are compensated for with regard to the currents supplied by them.

According to one or more aspects of the present invention, depending on a high or low phase of the differential clock signal CLKP, CLKN, an additional current, namely the compensation current, is conducted either to the base point 19 of master holding element 4 and slave differential stage 5 or of master differential stage 3 and slave holding element 6. The compensation current compensates for the corresponding current of the respective two base point current sources, 25, 28; 26, 27, so that either the stages 3, 6 or the stages 4, 5 are de-energized, that is to say switched off. The compensation current thus performs the function of an additional plane of transistors with additional differential stages which is occasionally provided in a circuit of this type.

With regard to toggle flip-flop, the input signals of the master block 1 correspond to the inverted output signals of the slave block 2, and the input signals of the slave block 2 correspond to the noninverted output signals of the master block 1. On account of the differential signal routing, the inversion can be achieved without any problems by means of simple line interchanging. The structure specified is connected in such a way that either the master differential amplifier 3 and the cross-coupled slave holding circuit 6 are active, that is to say have current flowing through them, or the holding stage 4 of the master block is activated together with the holding stage 5 of the slave. Thus, by way of example, during a high level at the clock inputs, a new output level is prepared in the master block 1, while the present states are maintained in the slave block. If the differential clock subsequently undergoes transition to its low phase, the slave block accepts the output signals of the master block at its outputs, while the master block itself freezes its previously assumed state for this period. The single inversion achieves continual toggling of flip-flop outputs 33 that are formed at the outputs of the differential stage 5 and of the holding stage 6 of the slave block 2.

It is possible to operate the circuit with a particularly small supply voltage since only a resistor, a current source and a transistor are connected between supply and reference potential terminals VDD, VSS. Consequently, supply voltages of significantly less than 2.0 V are possible with conventional integration techniques (e.g., 250 nm).

A further advantage is that the number of internal circuit nodes is particularly small. As a result, charge-reversal effects of parasitic capacitances are also small. This means that the circuit is suitable for operating at clock frequencies in the gigahertz range (e.g., 6 GHz).

Moreover, a further advantage is afforded by virtue of the fact that the small number of internal circuit nodes means that a compact layout of the overall circuit is possible, which in turn enables parasitic capacitances to be formed to a smaller extent thus permitting higher operating speeds.

Figure 2:
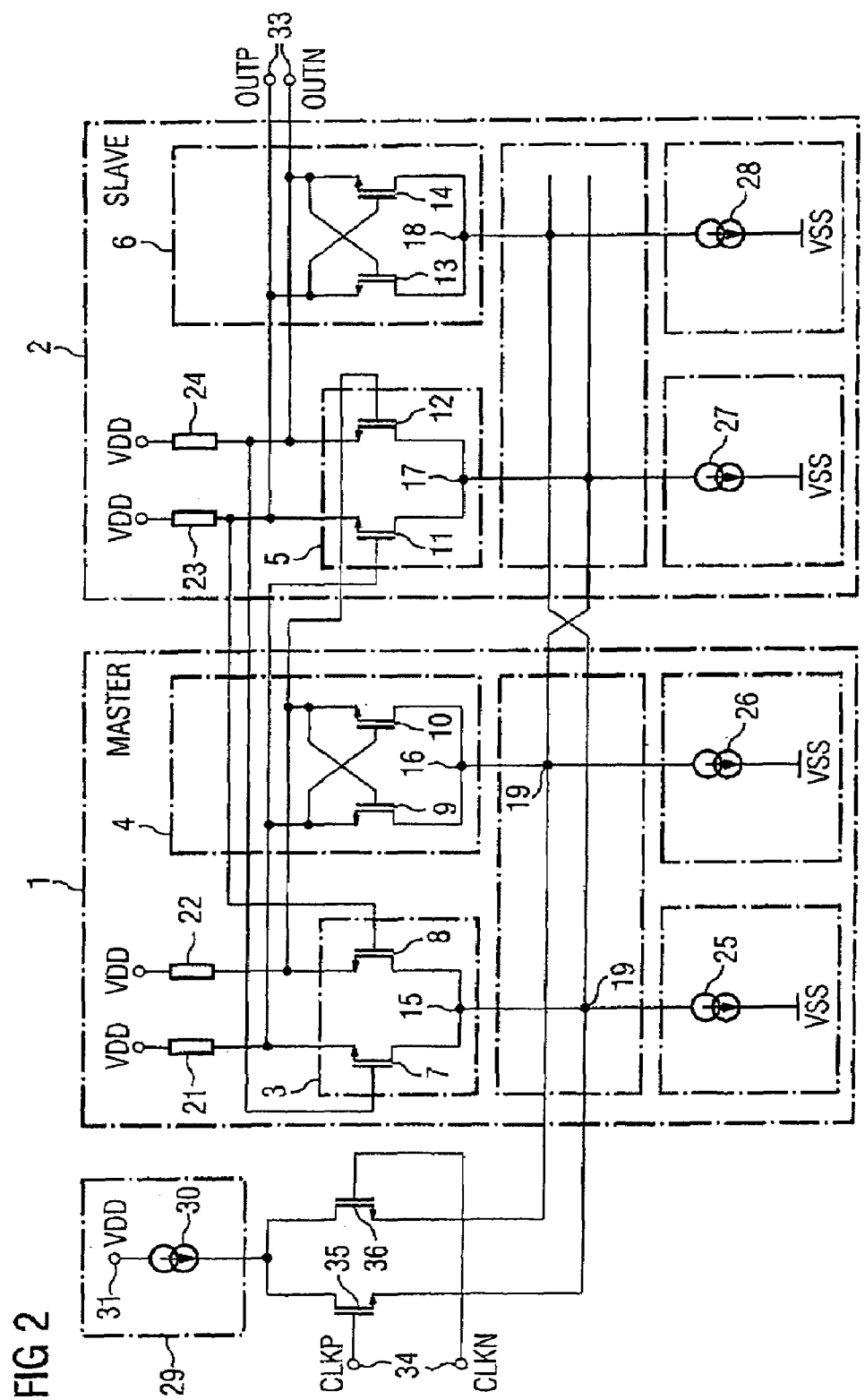
FIG. 2 is a schematic block diagram illustrating another exemplary flip flop circuit arrangement according to one or more aspects of the present invention.

FIG. 2 illustrates a further exemplary embodiment of a flip-flop circuit arrangement according to one or more aspects of the present invention, which, in terms of the components used, the advantageous interconnection thereof and also its functioning, largely corresponds to those of FIG. 1. In this respect, similar components in the circuit arrangement of FIG. 2 will not be described again at this juncture for purposes of simplicity.

Instead of the switching means 32 of FIG. 1, two p-channel MOS transistors 35, 36 are provided in FIG. 2. The PMOS transistors 35, 36 are connected to one another and to the compensation current source 30 at their drain terminals. The compensation current source 30 is again connected to a supply potential terminal 31. The source terminals of the p-channel MOS transistors 35, 36 are connected to the two terminals of the symmetrical base point 19. The gate terminals of the transistors 35, 36 form a differential clock input 34, that is to say the pair of input terminals which is designed for feeding in a differential clock signal CLKP, CLKN.

The circuit in accordance with FIG. 2 is distinguished in particular by its small supply voltage.

The clock signals CLKP, CLKN can be coupled in either directly or capacitively. In the case of capacitive coupling, which is not illustrated in FIG. 2, two series capacitors would have to be connected to the input 34. In this case, it might also be advantageous to connect an additional bias source for operating point setting of the transistors 35, 36 to the gate terminals thereof.

Figure 3:
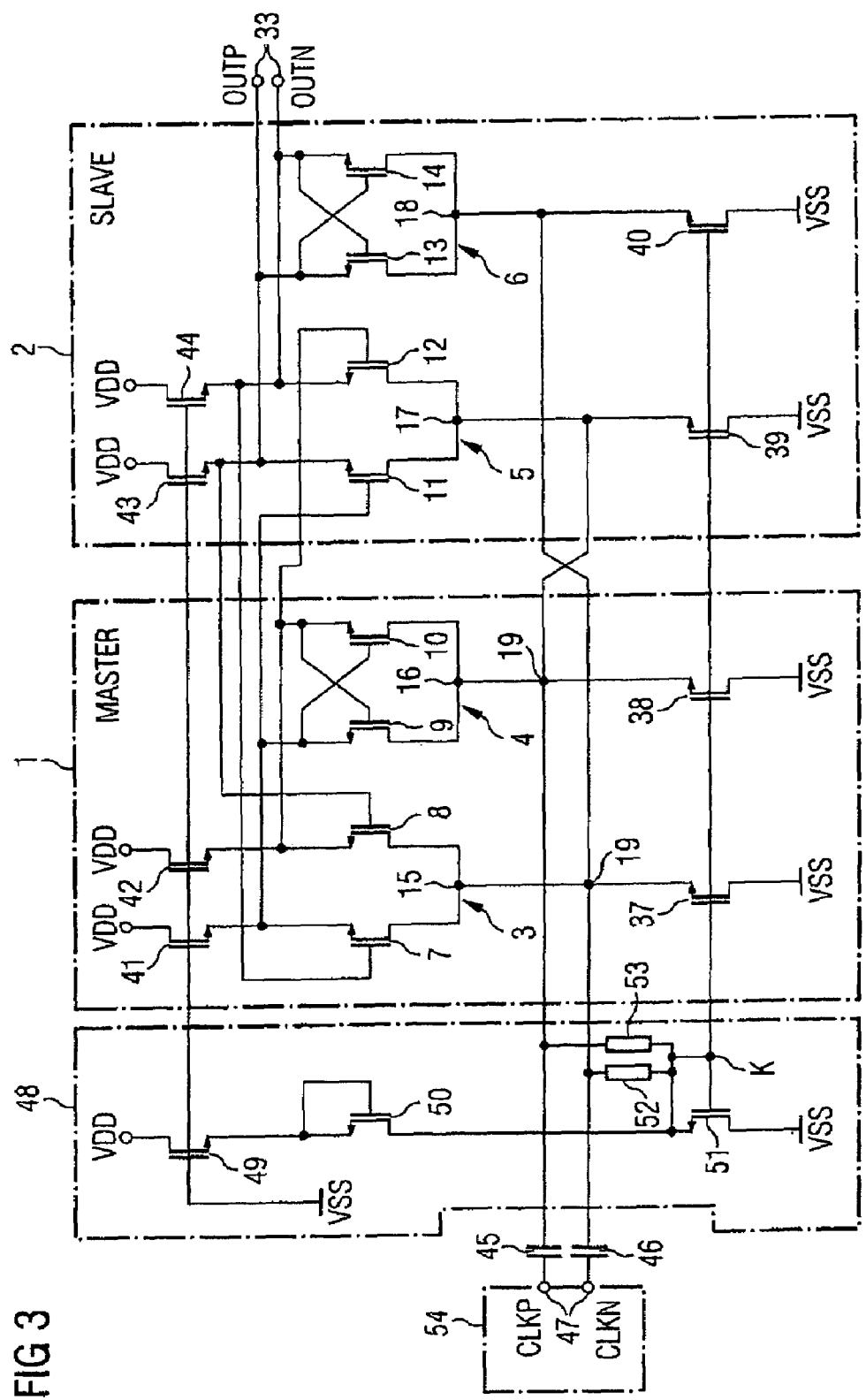
FIG. 3 is a schematic block diagram illustrating yet another exemplary flip flop circuit arrangement according to one or more aspects of the present invention.

FIG. 3 illustrates yet another exemplary embodiment of a flip-flop circuit arrangement in accordance with one or more aspects of the present invention, which has a direct, capacitive coupling of the symmetrical base point to a preceding stage. The circuit in accordance with FIG. 3, in terms of the components used, the advantageous interconnection thereof and its advantageous method of operation, largely corresponds to those of FIGS. 1 and 2 and, therefore, will not be described again at length. Instead of the current sources 25, 26, 27, 28 of FIGS. 1 and 2, respective n-channel MOS transistors 37, 38, 39, 40 are provided in FIG. 3, the controlled paths of which transistors are directly connected between the current terminals 15, 16, 17, 18 of the differential and holding stages 3, 4, 5, 6 and reference potential terminal VSS. The gate terminals of the transistors 37, 38, 39, 40 are directly connected to one another at a circuit node K. Instead of the resistors 21, 22, 23, 24 by means of which the outputs of the differential and holding stages 3, 4, 5, 6 are connected to the supply potential terminal VDD, p-channel transistors 41, 42, 43, 44 are provided in the case of the embodiment in accordance with FIG. 3, the gate terminals of said transistors being connected to one another and to the reference potential terminal VSS.

In FIG. 3, a capacitive coupling is provided instead of the controlled current source 30 and the switching means 32; 35, 36 of FIGS. 1 and 2. The capacitive coupling comprises two series capacitances 45, 46. The series capacitances 45, 46 are connected between the pair of input terminals 47 of the circuit arrangement and the symmetrical base point 19. A bias circuit 48 is additionally provided for operating point setting of the differential and holding stages 3, 4, 5, 6. The bias circuit comprises a p-channel transistor 49, the gate terminal of which is connected to those of the transistors 41, 42, 43, 44, which serve as an electrical load, and is connected to a reference potential terminal. The controlled path of the transistor 49 is connected between the supply potential terminal VDD and a transistor 50 operating as a diode. The transistor 50 is furthermore connected to the reference potential terminal VSS via a current mirror input transistor 51, which is likewise connected as a diode. The gate terminal of the current mirror input transistor 51 is connected to a node K which is in turn connected to the symmetrical base point 19 of the circuit via a respective coupling resistor 52, 53.

Given corresponding dimensioning of the circuit and sufficiently large signal levels at the input terminal pair 47, a direct, capacitive coupling to a preceding stage, for example an integrated oscillator 54 connected to the pair of input terminals 47, suffices. The compensation current which compensates for the current sources 37, 38, 39, 40 of the stages 3, 4, 5, 6 that are not actually being used is formed by capacitive charge-reversal currents in this case. A pure input current control is thus formed.

The operating point setting of this circuit comprises the feature that the supply currents of the stages 3, 4, 5, 6 that are fed in at the current terminals 15, 16, 17, 18 are provided by current mirrors having a common input transistor 51. Moreover, the electrical load transistors 41, 42, 43, 44 are coupled to the bias current source transistor 49.

The circuit in accordance with FIG. 3 is based entirely on current mode logic, CML, circuit technology in the actual sense. In this case, the logic levels are set by means of a correspondingly controlled current flow. The circuit of FIG. 3 works directly with differential current signals at the input 47, which are provided by purely capacitive charge-reversal currents. This exploits the fact that, in practically any application of a toggle flip-flop or frequency divider, a comparatively narrow frequency band of 2 to 4 GHz, for example, has to be processed. On account of the particularly small parasitic capacitances, the frequencies of resonance effects can be driven into very high ranges. The capacitive loading which the circuit of FIG. 3 permits on the output of a stage connected upstream can be adapted by dimensioning the input coupling capacitances 45, 47 and is unproblematic, for example in the case of connection to an oscillator.

It goes without saying that it lies within the scope of the invention for the proposed principle of compensation of differential amplifier currents by compensation currents and the creation of genuine current control brought about as a result also to be applied to exemplary embodiments other than the ones illustrated herein. In the case of the exemplary embodiments, a complementary circuit technology may also be chosen, by way of example, in alternative embodiments.

Figure 4A:
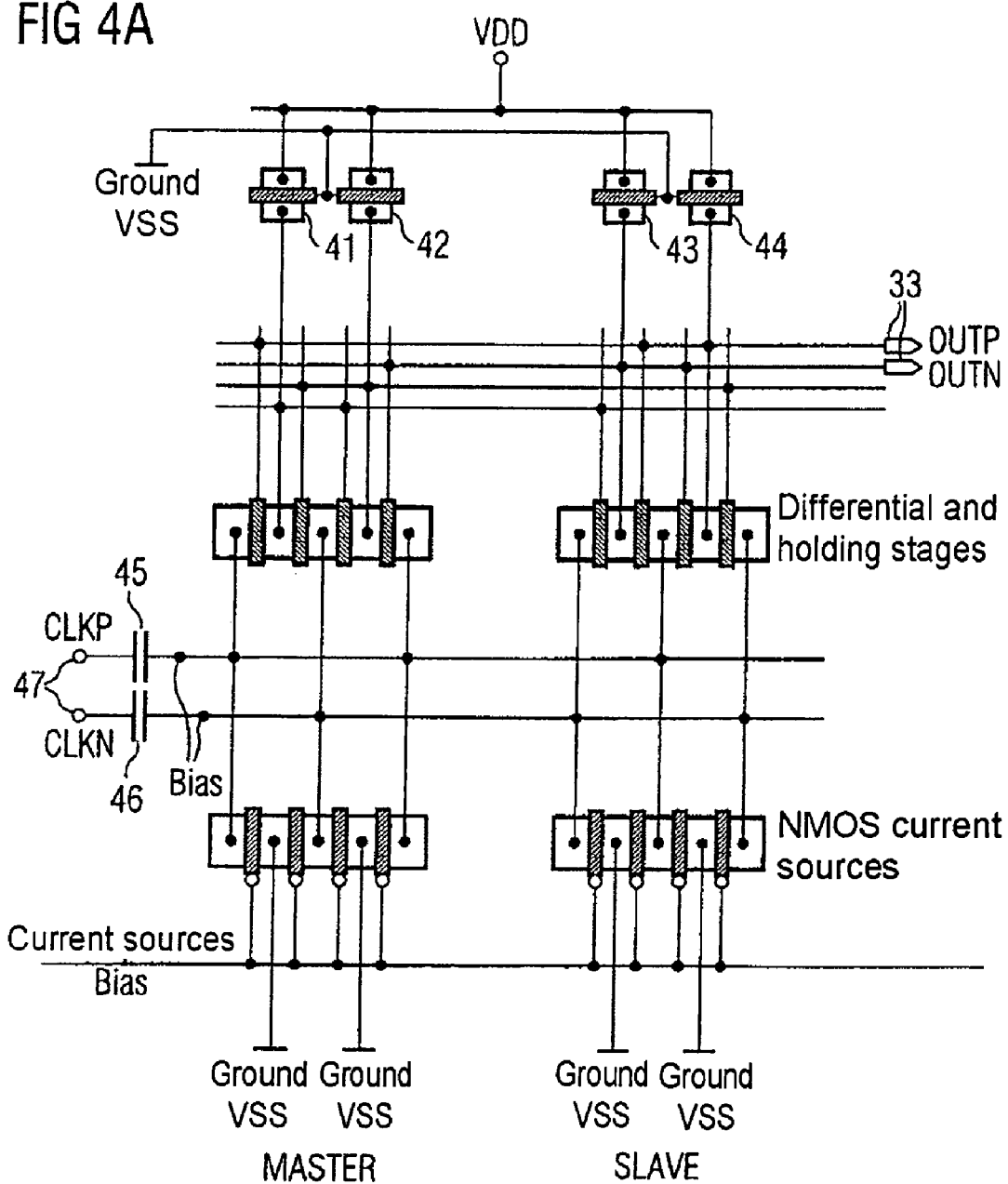
FIG. 4A is a schematic diagram illustrating an exemplary layout for the circuit arrangement depicted in FIG. 3 according to one or more aspects of the present invention.

FIG. 4a illustrates the extremely compact layout of a complete flip-flop core in accordance with one or more aspects of the present invention, such as that illustrated in FIG. 3.

Figure 4B:
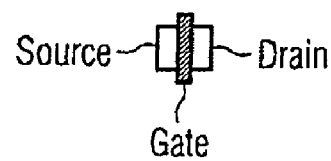
FIG. 4B illustrates an elucidation of a MOS transistor in accordance with the layout presented in FIG. 4A.

In FIG. 4a an illustration is chosen which is elucidated in FIG. 4b on the basis of a MOS transistor having gate, source and drain.

In accordance with FIGS. 1 to 3, the pair of input terminals 47 for feeding in the clock signals CLKP, CLKN is also depicted in FIG. 4a, as is the pair of output terminals 33 for tapping off the output signal OUTP, OUTN at a halved clock frequency. In this case, identical reference symbols designate identical or identically acting circuit components.

It is evident that, on account of the compact layout, a maximum operating frequency of more than 6 GHz is possible including taking account of additional parasitic capacitances as a result of wiring effects on the basis of an integrated 250 nm fabrication technology and a supply voltage of 2.0 V.

In order to divide down a clock frequency further, it is (advantageously) possible to cascade a plurality of the frequency dividers by way of example in FIGS. 1 to 3.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (e.g., assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising." Also, exemplary is merely intended to mean an example, rather than the best.

List of Reference Symbols
1 Master block
2 Slave block
3 Master differential stage
4 Master holding stage
5 Slave differential stage
6 Slave holding stage
7 Transistor
8 Transistor
9 Transistor
10 Transistor
11 Transistor
12 Transistor
13 Transistor
14 Transistor
15 Current terminal
16 Current terminal
17 Current terminal
18 Current terminal
19 Symmetrical base point
20 Pair of input terminals
21 Resistor
22 Resistor
23 Resistor
24 Resistor
25 Current source
26 Current source
27 Current source
28 Current source
29 Means for providing a compensation current
30 Compensation current source
31 Supply potential terminal
32 Switching means
33 Pair of output terminals
34 Pair of input terminals
35 Transistor
36 Transistor
37 Transistor
38 Transistor
39 Transistor
40 Transistor
41 Transistor
42 Transistor
43 Transistor
44 Transistor
45 Capacitance
46 Capacitance
47 Pair of input terminals
48 Means for operating point setting
49 Transistor
50 Diode
51 Diode
52 Coupling resistor
53 Coupling resistor
54 Oscillator
CLKP Clock
CLKN Clock
OUTP Output signal
OUTN Output signal
VDD Supply potential
VSS Reference potential

The invention claimed is:
1. A flip-flop circuit arrangement, comprising:
a pair of input terminals designed for feeding in a differential clock signal (CLKP, CLKN);
a pair of output terminals designed for tapping off a differential output signal (OUTP, OUTN);
a master holding stage coupled to a master differential stage;
a slave holding stage coupled to a slave differential stage;
wherein the master differential stage, the master holding stage, the slave differential stage and the slave holding stage are coupled to one another in order to form a flip-flop structure;
wherein the pair of output terminals is formed at the output of the slave differential stage;
wherein, at a symmetrical base point, a current terminal of the master differential stage, a current terminal of the master holding stage, a current terminal of the slave differential stage and a current terminal of the slave holding stage are connected to one another and to respective current sources for feeding the master and slave differential and holding stages;
a means for providing a compensation current which is coupled to the pair of input terminals and to the symmetrical base point in order to compensate for the current provided by at least one of the current sources in a manner dependent on the differential clock signal (CLKP, CLKN);
wherein inputs of the slave differential stage are coupled to outputs of the master differential stage in a noninverting manner, and inputs of the master differential stage are coupled to outputs of the slave differential stage in an inverting manner; and
wherein the means for providing the compensation current comprises at least one of:
at least one compensation current source, which is selectively connected to one of two terminals of the symmetrical base point via a switching means, the switching means being coupled to the pair of input terminals for driving the switching means, and
two capacitors connected between a different one of the pair of input terminals and the symmetrical base point.
2. The flip-flop circuit arrangement of claim 1, wherein the master differential stage, the master holding stage, the slave differential stage and the slave holding stage comprise respective transistor pairs having two inputs, two outputs and the respective current terminals.
3. The flip-flop circuit arrangement of claim 1, wherein inputs and outputs of the master holding stage are cross- coupled to one another and inputs and outputs of the slave holding stage are cross-coupled to one another.

4. The flip-flop circuit arrangement of claim 3, wherein the outputs of the master holding stage are coupled to the outputs of the master differential stage and the outputs of the slave holding stage are coupled to the outputs of the slave differential stage.

5. The flip-flop circuit arrangement of claim 1, wherein the means for providing the compensation current effects a changeover in a manner dependent on the differential clock signal (CLKP, CLKN) in such a way that either the master differential stage and the slave holding stage are activated and the slave differential stage and the master holding stage are deactivated, or that the master differential stage and the slave holding stage are deactivated and the slave differential stage and the master holding stage are activated.

6. The flip-flop circuit arrangement of claim 1, wherein respective current sources are connected to the respective current terminals of the master differential stage, of the master holding stage, of the slave differential stage and of the slave holding stage.

7. The flip-flop circuit arrangement of claim 1, wherein the at least one compensation current source is connected to a supply potential terminal of the circuit arrangement.

8. The flip-flop circuit arrangement of claim 1, wherein the switching means comprises a p-channel transistor pair.

9. The flip-flop circuit arrangement of claim 1, wherein a means for operating a point setting is provided, which is coupled to the symmetrical base point.

10. The flip-flop circuit arrangement of claim 9, wherein the means for operating the point setting comprises a current mirror, which interacts with the respective current sources for feeding the master and slave differential and holding stages.

11. The flip-flop circuit arrangement of claim 10, wherein the means for operating the point setting comprises two coupling resistors for coupling the current mirror to the symmetrical base point.

12. The flip-flop circuit arrangement of claim 1, wherein the circuit arrangement is formed using integrated metal insulator semiconductor circuit technology.

13. The flip-flop circuit arrangement of claim 1, wherein the arrangement is used in a frequency divider.

14. A method for processing a signal, comprising:

providing a differential clock signal (CLKP, CLKN);

selectively activating/deactivating in an alternative fashion a master differential stage and a slave differential stage of a flip-flop circuit arrangement in a manner dependent on the differential clock signal (CLKP, CLKN);

providing a compensation current (I); and alternating compensation of a current supplying the master differential stage or of a current supplying the slave differential stage with the compensation current (I) in a manner dependent on the differential clock signal (CLKP, CLKN), wherein the compensation current is generated as a capacitive charge-reversal current by a stage providing the differential clock signal (CLKP, CLKN).

15. The method of claim 14, wherein a slave holding stage is activated and deactivated with the master differential stage, and a master holding stage is activated and deactivated with the slave differential stage.

16. The method of claim 14, wherein the compensation current (I) is generated by means of a compensation current source fed by a supply voltage (VDD).

17. The method of claim 14, further comprising:

providing a common-mode level for operating a point setting of the master and slave differential stages.

* * * * *